(12) United States Patent
Sperschneider et al.

(10) Patent No.: US 7,103,554 B1
(45) Date of Patent: Sep. 5, 2006

(54) METHOD AND DEVICE FOR GENERATING A DATA FLOW FROM VARIABLE-LENGTH CODE WORDS AND A METHOD AND DEVICE FOR READING A DATA FLOW FROM VARIABLE-LENGTH CODE WORDS

(75) Inventors: Ralph Sperschneider, Erlangen (DE); Martin Dietz, Nuremberg (DE); Pierre Lauber, Nuremburg (DE); Michael Schug, Erlangen (DE)

(73) Assignee: Fraunhofer-Gesellschaft zue Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/914,114

(22) PCT Filed: Jan. 17, 2000

(86) PCT No.: PCT/EP00/00312

§ 371 (c)(1),
(2), (4) Date: Dec. 14, 2001

(87) PCT Pub. No.: WO00/51241

PCT Pub. Date: Aug. 31, 2000

(30) Foreign Application Priority Data

Feb. 23, 1999 (DE) ............................... 199 07 729

(51) Int. Cl.
G10L 19/00 (2006.01)
H04N 11/04 (2006.01)
H04N 5/91 (2006.01)

(52) U.S. Cl. .................... 704/500; 704/200.1; 386/95; 386/52; 386/124; 375/240.12; 348/415.1

(58) Field of Classification Search ........ 704/500–504, 704/200.1; 386/52, 124, 95, 105; 375/240.12; 348/415.1
See application file for complete search history.

(56) References Cited

U.S. PATENT DOCUMENTS 5,148,271 A 9/1992 Kato et al. .................. 358/133

(Continued)

FOREIGN PATENT DOCUMENTS

CA 2356869 7/2000

(Continued)

*Primary Examiner*—Vijay B. Chawan
(74) *Attorney, Agent, or Firm*—Michael A. Glenn; Glenn Patent Group (57) ABSTRACT

In a method for producing a data stream of code words of variable lengths which are divided up into a plurality of sets of code words, wherein a raster having segments is specified for the data stream, wherein two adjacent raster points define a segment, code words of the first sets are written into the data stream starting at raster points. Subsequently, code words of the second set are written into the data stream pursuant to a predetermined assignment rule, wherein each code word of the second set is assigned to a different segment. Entire code words or parts of code words which cannot be written according to their assignment, are stored and entered into the data stream in further attempts, wherein the assignment by a predetermined regulation is changed from attempt to attempt. This procedure is analogously repeated for any further set which may be present. Thus, the ends of code words of the second set are decoupled from the starts of following code words of the second set, since the corresponding code words of a set are written segment by segment, which results in a reduction of error propagation.

25 Claims, 6 Drawing Sheets

U.S. PATENT DOCUMENTS

| | | | |
|---|---|---|---|
| 5,481,614 A * | 1/1996 | Johnston .......................... 381/2 |
| 5,592,584 A * | 1/1997 | Ferreira et al. ............. 704/203 |
| 5,838,597 A * | 11/1998 | Pau et al. ................... 708/203 |
| 5,956,088 A * | 9/1999 | Shen et al. ............ 375/240.25 |
| 6,020,934 A * | 2/2000 | Greenfield et al. .......... 348/699 |
| 6,122,619 A * | 9/2000 | Kolluru et al. ............. 704/500 |
| 6,223,162 B1 * | 4/2001 | Chen et al. ................. 704/503 |
| 6,263,312 B1 * | 7/2001 | Kolesnik et al. ............ 704/500 |
| 6,339,760 B1 * | 1/2002 | Koda et al. ................. 704/278 |
| 6,377,930 B1 * | 4/2002 | Chen et al. ................. 704/503 |
| 6,434,196 B1 * | 8/2002 | Sethuraman et al. ... 375/240.12 |
| 6,480,828 B1 * | 11/2002 | Okada et al. ............... 704/500 |
| 6,804,655 B1 * | 10/2004 | Dokic et al. ................ 704/500 |

FOREIGN PATENT DOCUMENTS

| | | |
|---|---|---|
| CA | 2363955 | 8/2000 |
| DE | 37 02 490 | 1/1987 |
| DE | 691 26 565 | 4/1991 |
| DE | 197 47 119 | 10/1997 |
| EP | 492 537 | 7/1992 |
| EP | 612 156 | 8/1994 |

* cited by examiner

Fig. 1

Fig. 2 a) Writing the code words of the 1st set b) Writing the code words of the second set Attempt 1 (7 in 1, 8 in 2, 9 in 3, 10 in 4, 11 in 5, 12 in 6) : storing 7b Attempt 2 (7 in 2) :

Fig. 3 c) Extracting the code words of the 3rd set

Attempt 1 ( 13 in 1, 14 in 2, 15 in 3) : storing 13, 14, 15b

Attempt 2 ( 13 in 2, 14 in 3, 15 in 4) : storing 13,14

Attempt 3 (13 in 3, 14 in 4) : storing 13,14

Attempt 4 (13 in 4, 14 in 5) : storing 13, 14b

Attempt 5 (13 in 5, 14 in 6) : storing 13

Attempt 6 (13 in 6)

Error-robust data stream

Fig. 3 (continued)

a) Extracting the code words of the first set b) Extracting the code words of the second set Attempt 1 (searching 7 in 1, 8 in 2, 9 in 3, 10 in 4, 11 in 5, 12 in 6)

Attempt 2 ( searching 7 in 2)

Fig. 4 c) Extracting the code words of the 3rd set

Attempt 1 (searching 13 in 1, 14 in 2, 15 in 3)

Storing 15a

Attempt 2 (searching 13 in 2, 14 in 3, 15 in 4)

Attempt 3 (searching 13 in 3, 14 in 4)

Attempt 4 (searching 13 in 4, 14 in 5)

Storing 14a

Attempt 5 (searching 13 in 5, 14 in 6)

Attempt 6 (searching 13 in 6)

METHOD AND DEVICE FOR GENERATING A DATA FLOW FROM VARIABLE-LENGTH CODE WORDS AND A METHOD AND DEVICE FOR READING A DATA FLOW FROM VARIABLE-LENGTH CODE WORDS

The present invention relates to encoding with code words of variable lengths and, in particular, to producing and reading data streams with code words of variable lengths, which are robust with regard to errors in transmission.

Modern audio encoding or decoding methods which work by the MPEG layer 3 standard, for example, are capable of compressing the data rate of audio signals, e.g. by a factor 12, without noticeably degrading the quality thereof. In order to achieve such a high data rate reduction, an audio signal is sampled, whereby a sequence of discrete-time samples is obtained. As is known in the art, the sequence of discrete-time samples is windowed in order to obtain windowed blocks of time samples. A block of time-windowed samples is then transformed to the frequency range by means of a filter bank, a modified discrete cosine transform (MDCT) or other suitable device, in order to obtain spectral values which, as a whole, represent the audio signal, i.e. the time section determined by the block of discrete-time samples, in the frequency range. Usually, time blocks which overlap at 50% are produced and transformed to the frequency range by means of a MDCT whereby, due to the specific properties of the MDCT, 1024 discrete-time samples, for example, always lead to 1024 spectral values.

It is known that the receptivity of the human ear depends on the momentary spectrum of the audio signal itself. This dependency is covered in the so-called psycho-acoustic model by means of which it has been possible for quite some time to calculate masking thresholds depending on the momentary spectrum. Masking means that a specific tone or a spectral component is hidden in case an adjacent spectral range, for example, has relatively high energy. This fact of masking is utilized in order to quantize as closely as possible the spectral values present after the transformation. The aim is therefore to avoid audible interferences in the re-decoded audio signal on the one hand and to use as few bits as possible on the other hand in order to encode or, in this case, to quantize the audio signal. The interferences introduced by quantization, i.e. quantization noise, are intended to be below the masking threshold and, therefore, to be inaudible. In accordance with known methods, a classification of the spectral values in so-called scale factor bands is carried out, which should correspond to the critical bands, i.e. frequency groups, of the human ear. Spectral values in a scale factor group are multiplied by a scale factor in order to carry out overall scaling of spectral values of a scale factor band. The scale factor bands scaled by the scale factor are then quantized, whereupon quantized spectral values are produced. It is understood that grouping in scale factor bands is not critical. However, it is used in the MPEG layer 3 standards or in the MPEG 2 AAC standard (AAC=advanced audio coding).

A very essential aspect of data reduction lies in entropy encoding of the quantized spectral values, which follows quantizing. Huffman encoding is usually used for entropy encoding. A Huffman coding is understood to mean a coding with a variable length, i.e. the length of the code word for a value to be encoded is dependent on the probability of occurrence thereof. Logically, the most probable character is assigned the shortest code, i.e. the shortest code word, so that very good redundancy reduction can be achieved by means of Huffman encoding. An example for a generally-known coding with a general length is the Morse code.

In the field of audio encoding, Huffman codes are used for encoding the quantized spectral values. A modern audio encoder, which works, for example, in accordance with the MPEG 2 AAC standard, uses different Huffman code tables for encoding the quantized spectral values, which Huffman code tables are assigned to the spectrum by certain criteria on a section-by-section basis. In this process, 2 or 4 spectral values are always encoded together in one code word.

One difference between the method in accordance with MPEG 2 AAC and the method in accordance with MPEG layer 3 is that different scale factor bands, i.e. different spectral values, are grouped into any number of spectral sections. With AAC, one spectral section includes at least four spectral values, but preferably more than four spectral values. The entire frequency range of the spectral values is therefore divided up into adjacent sections, with one section representing one frequency band such that all sections together cover the entire frequency range, which is superimposed by the spectral values after the transformation thereof.

As in the MPEG layer 3 method, one section is assigned to a so-called "Huffman table" from a plurality of such tables in order to achieve a maximum redundancy reduction. In the bit stream of the AAC method, which usually comprises 1024 spectral values, are now the Huffman code words for the spectral values in an ascending order of frequencies. The information on the table used in each frequency section is transferred in the side information. This situation is shown in FIG. 6.

Figure 6:
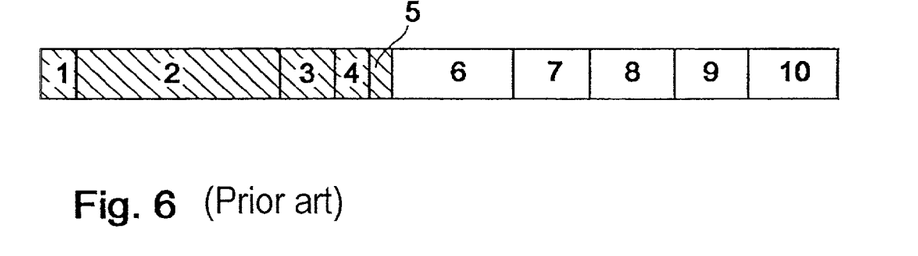
FIG. 6 shows a data stream in which sorting by priority code words and non-priority code words has been carried out.

FIG. 6 shows the exemplary case where the bit stream includes 10 Huffman code words. In case one code word is always formed from one spectral value, 10 spectral values may be encoded here. However, usually 2 or 4 spectral values are always jointly encoded by one code word, which is why FIG. 6 shows a part of the encoded bit stream which includes 20 or 40 spectral values. In the case where each Huffman code word includes 2 spectral values, the code word designated by No. 1 represents the first two spectral values, with the length of code word No. 1 being relatively short, which means that the values of the first two spectral values, i.e. of the two smallest frequency coefficients, occur relatively frequently. The code word bearing the No. 2, however, has a relatively long length, which means that the amounts of the $3^{rd}$ and $4^{th}$ spectral coefficients in the encoded audio signal are relatively rare, which is why they are encoded with a relatively large amount of bits. Further, it is apparent from FIG. 6 that the code words with the numbers 3, 4 and 5, which represent the spectral coefficients 5 and 6 or 7 and 8 or 9 and 10, also occur relatively frequently, since the length of the individual code words is relatively small. The same applies to the code words bearing the numbers 6 to 10.

As has already been mentioned, it is clearly apparent from FIG. 6 that the Huffman code words for the encoded spectral values are arranged in the bit stream in a linearly ascending manner with regard to the frequency in case a bit stream which is produced by a known encoding apparatus is considered.

One major drawback with regard to Huffman codes, in the case of faulty channels, is error propagation. It may be assumed, for example, that code word No. 2 in FIG. 6 is interfered with. There is a certain, not low, probability that the length of this wrong code word No. 2 is also modified. It therefore is different from the correct length. In case, in the example of FIG. 6, code word No. 2 has been modified in its length due to an interference, it is no longer possible for an encoder to determine the starts of the code words 3 to 10, i.e. of almost the entire audio signal represented. This means that all other code words following the code word which has been interfered with can no longer be correctly encoded, since it is not known where these code words start, and since an incorrect starting point was selected due to the error.

As a solution to the problem of error propagation, European Patent No. 0 612 156 proposes that a part of the code words of variable lengths be arranged in a raster and that the remaining code words be distributed in the remaining gaps, so that the start of a code word which is arranged at a raster point can be more easily found without full decoding or in the case of an incorrect transmission.

It is true that the known method provides some remedy for error propagation by means of rearranging the code words. For some code words, a fixed location in the bit stream is agreed upon, whereas the remaining gaps are available for the remaining code words. This does not cost any additional bits, but prevents, in the case of an error, error propagation among the rearranged code words.

However, one decisive parameter for the efficiency of the known method lies in the manner in which the raster is determined in practical application, i.e. how many raster points must be used, which raster spacing the raster points must have, etc. Except for the general recommendation to use a raster for curbing error propagation, European Patent No. 0 612 156 does not give any more detailed information about how the raster should be designed efficiently in order to enable error-robust encoding on the one hand and efficient encoding on the other hand.

Figure 5:
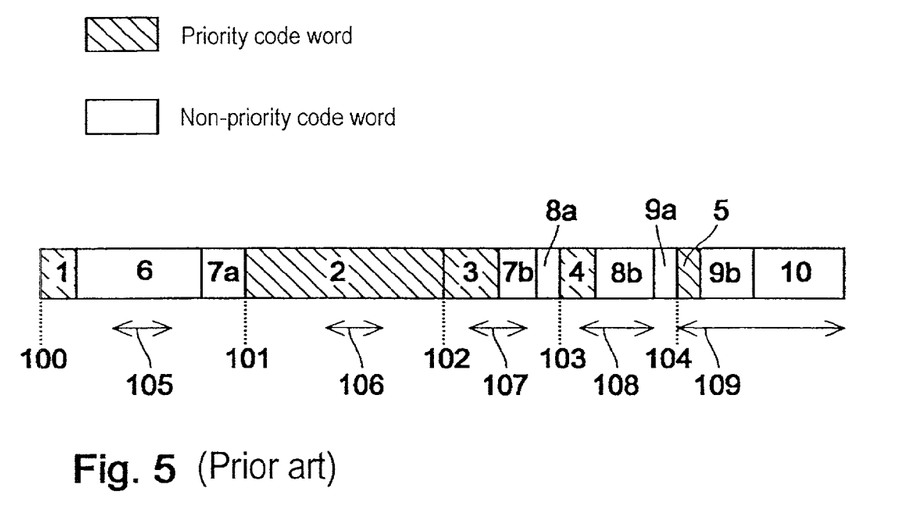
FIG. 5 shows a data stream which is produced by a known apparatus and in which the priority code words are exposed to error propagation.

German Patent Application 19 747 119.6-31, which was published after the filing date of the present application, proposes that not just any code words be located at raster points, but that code words which are significant from a psycho-acoustic point of view, i.e. code words for spectral values which make a significant contribution to the audio signal, be located at raster points. A data stream with code words of variable lengths, such as is produced by such an encoder, is shown in FIG. 5. As in FIG. 6, the data stream also includes 10 code words, with the priority code words being shaded. The first priority code word is located such as to start at a first rater point 100, the second priority code word is located such as to start at a second raster point 101, the third priority code word is located such as to start at a third raster point 102, the fourth priority code word is located such as to start at a fourth raster point 103 and the fifth priority code word is located such as to start at a fifth raster point 104. A first segment 105 is defined by the raster points 100 and 101. Similarly, a second 106, a third 107, a fourth 108 and a final segment 109 are defined. It is shown in FIG. 5 that the first two segments 105 and 106 have a different length from the two segments 107 and 108 and yet a different length from the final segment 109. Non-priority code words 6, 7, 8, 9 and 10 are then entered in the data stream following the priority code words such that the latter is filled up, so to speak. As is shown in FIG. 5, in the post-published method, the non-priority code words are consecutively inserted in the raster after the priority code words have been written. Specifically, the non-priority code word No. 6 is entered following the non-priority code word 1. The space still remaining in the segment 105 is filled up with the following non-priority code word 7, with the remainder of the non-priority code word 7, i.e. 7b, being written in the next free space, i.e. in the segment 107, directly following the priority code word 3. The same procedure is followed for the non-priority code words 8 to 10.

The advantage of the post-published method illustrated in FIG. 5 is that the priority code words 1 to 5 are protected against error propagation, since their starting points coincide with raster points and are therefore known.

In case, for example, the priority code word 2 has been damaged in transmission, it is very likely in the prior art shown in FIG. 6 that a decoder will not be able to decode any of the remaining code words 3 to 10 correctly. In the method shown in FIG. 5, however, the next code word, i.e. priority code word 3, starts at the raster point 102 such that the decoder will, at any rate, find the correct start of code word 3. Therefore, in the method shown in FIG. 5, no sequence error whatsoever will occur, and only priority code word No. 2 will be damaged. Consequently, this method provides effective protection for priority code words which are located at raster points.

However, there is no effective protection for non-priority code words. Referring to FIG. 5, damaging the non-priority code word No. 6 such that the decoder assumes, as an incorrect code word No. 6, a code word which is one bit shorter, will result in the fact that it is also no longer possible to correctly decode code word No. 7, since the last bit of the correct code word No. 6 is interpreted as being the start of the next code word No. 7. Therefore, an error in code word No. 6 will lead to the fact that, at a very high probability, it will no longer be possible, due to a sequence error, to correctly decode any code words following it even in case they have not been affected by a transmission error.

It is the object of the present invention to find a concept for writing and reading a data stream of code words of variable lengths which provides particular protection against sequence errors due to a non-ideal transmission of the data stream.

This object is achieved by a method for producing a data stream in accordance with claim 1, by a method for reading a data stream in accordance with claim 15, by an apparatus for producing a data stream in accordance with claim 20 and an apparatus for reading a data stream in accordance with claim 21.

The present invention is based on the realization that a data stream having code words of variable lengths must be configured such that successive code words are decoupled in the data stream as soon as possible such that a decoder will not produce a very high number of sequence errors due to a transmission error. For this purpose, code words of variable lengths to be transmitted are divided up into a plurality of sets. The first set may include priority code words, whereas the second set may include non-priority code words. In order to also protect non-priority code words from transmission errors, they are not simply written into the unoccupied raster, as in the prior art, but are distributed in the individual segments. After a fixed assignment which is known to the recipient, non-priority code words are assigned to the segments such that each non-priority code word, i.e. each code word from the second set, is assigned to a different segment of the data stream. In order for this to work, each set may only have so many code words as there are segments for the data stream. Therefore, the first set of code words is written into the raster such that each code word of the first set starts at a raster point. An attempt is then made to write each code word of the second set into the data stream such that each code word of the second set is assigned to a different segment. Due to this assignment, i.e. each code word of the second set is written into a different segment, a decoder will no longer simply successively decode the code words of the second set but go to the corresponding segment for each code word of the second set in the raster in order to extract the corresponding code word of the second set from this segment.

In case, already after the code word of the first set has been written into a segment, this segment is so full that there is only partially room for the code word of the second set assigned to this segment or that there is no more room at all, that part of the code word of the second set for which there is still room is written into the assigned segment, the remainder being stored. In case there is no room at all for the code word, the entire code word is stored until the assignment of each code word of the second set has been attempted. It is only then that a second attempt will be made to write the stored parts or the stored complete code words of the second set, in accordance with a predetermined regulation, to segment sections which are still unoccupied.

In case the raster is configured such that code words of the first set exist which are longer than the segment length, the same method may be applied as early as for writing the first set of code words.

Once a decoder has extracted the code words of the first set which start at raster points from the data stream, it proceeds to extract the code words of the second set. In case a decoder finds only part of a code word of the second set of code words, this part will be stored and the process is continued by looking for the next code word of the second set in a different segment. Only after all segments have been searched in such a first attempt, the missing part of a code word of the second set will be determined in a second or a further attempt, or a code word of the second set, whose assigned segment had already been occupied by the code word of the first set, is determined.

Referring to FIG. 5, an error in code word No. 6 will therefore no longer lead to an error in code word No. 7, since code word No. 7 would start in a different segment from segment 105, and code word No. 6 would be followed by an entirely different code word not adjacent to it.

A simple example may be used for further illustration. It is based on the assumption that two code words in the first set and two code words in the second set, that is to say, a total of four code words of variable lengths, are present. It is further assumed, for comparison with the prior art, that the code words 1 and 3 together are sufficiently long to fit in the first segment, and that code words 2 and 4 together are sufficiently long to completely fit in the second segment. In this case, an apparatus in accordance with the prior art would write the same data stream as an apparatus in accordance with the present invention. The apparatus in accordance with the prior art would firstly write the priority code words 1 and 2 to the two raster points and thereafter write code word No. 3 following code word No. 1 and write code word No. 4 to the next vacant space in the raster, that is to say following code word No. 2. Purely coincidentally, code word No. 4 is therefore no longer (at least partially) in the first segment, but entirely in the second segment.

An apparatus in accordance with the invention will initially write the code words of the first set to the corresponding raster points and will then write the first code word of the second set into the first segment and the code word of the second set into the second segment, irrespective of whether or not there is still room in the first segment. The apparatus in accordance with the invention will therefore attempt, at any rate, to write each code word of the second set into a different segment.

Even though both data streams coincidentally look identical, a significant difference will result for the recipient who will extract the code words of variable lengths from the data stream in order to place them in their order which is required for a decoder. In the prior art, an apparatus will, for extracting, initially read code word No. 1 at the first raster point and code word No. 2 at the second raster point, in order to obtain the code words of the first set. Thereafter, an apparatus in accordance with the prior art will go to the start of the remaining data stream and read code word No. 3 there, and following therein, read code word No. 4.

An apparatus in accordance with the present invention will, after reading code words 1 and 2 of the first set, also go to the start of the remaining data stream and read code word No. 3 there. However, the apparatus in accordance with the invention will thereafter jump to the next segment in order to read the start of the fourth code word, i.e. the second code word of the second set.

It shall now be assumed, in the following, that code word No. 3, i.e. the first code word of the second set, which was written behind the first code word of the first set in the fictitious data stream, has been interfered with such that a decoder will interpret the same as a shorter code word than it actually is. In this case the known apparatus for reading the data stream will read code word No. 3 and will, due to the transmission error, stop too soon and will judge the remaining bit or bits, which actually belonged to code word No. 3, to be the start of code word No. 4. The apparatus in accordance with the invention, however, will jump to the next segment after code word No. 3 has been terminated, and will therefore correctly determine the start of code word No. 4.

Using this simple example, the essential advantage of the present invention can clearly be seen in that it prevents, due to the division of the code words of the second set into the individual segments, sequence errors also in code words of the second set, which may be, for example, non-priority code words. As has been described with reference to No. 5, in the prior art, however, sequence errors occur even though the data streams of code words of variable lengths which are produced by the prior art and by the present invention, may be identical by coincidence.

Preferred embodiments of the present invention will be explained in detail below with reference to the attached drawings, in which.

Before FIG. 1 will be described in more detail, it should be noted that encoding with code words of variable lengths is also referred to as entropy encoding in the art. One representative example of entropy encoding is the so-called Huffman encoding. In principle, in Huffman encoding, the information symbols to be encoded are statistically examined in order to determine shorter code words for the information symbols occurring more frequently than for information symbols occurring less frequently. In a complete Huffman code, all code words are terminated ends or branches of a code tree. For example, a Huffman decoder serially reads in a data stream with Huffman code words and, put graphically, jumps to a branching of the specified code tree with each bit that it reads in additionally until, after a certain number of jumps, which corresponds to the number of bits of the code word, i.e. to the length of the code word, it arrives at a branch end which does not have any further branching and is therefore a code word. The decoder then knows that a new code word starts with the next bit. This process is repeated as often as required until the data stream has been completely read in. With each time that the Huffman encoder jumps back to the starting point, i.e. to the root of the tree, a code word is present at its point of origin. Since the lengths of the code words are implicitly specified by the code words themselves or by the code tree known in the encoder and in the decoder, it can be seen that an interference in the data stream which leads to a reversal of a bit misleads the decoder in the code tree, so to speak such that it ends up with a different code word, i.e. an incorrect code word, which is very likely to have a different length from the correct code word. In this case, the decoder will, once it has arrived at the incorrect code word, jump back and, due to the bits then following, again move from one branching point to another in the code tree. However, it is not possible for the decoder to avoid a sequence error, unless it coincidentally ends up on the "correct track".

Therefore, error protection, as is provided by the present invention, must be performed in order to ensure error-robust transmission. The apparatus for producing a data stream of code words of variable lengths in accordance with the present invention may therefore act as a sending or output stage of a Huffman encoder, as it were, whereas the apparatus for reading a data stream of code words of variable lengths may act as a receiving or input stage of a Huffman encoder. It can be seen from this that the present invention is not only applicable to Huffman encoders, but to any code having code words of variable lengths which is susceptible to sequence errors.

Figure 1:
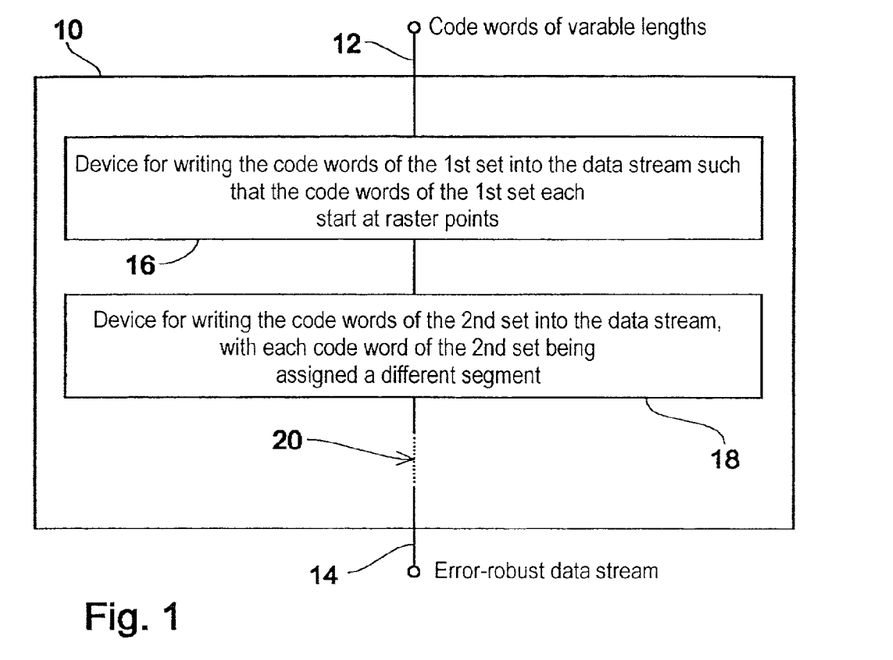
FIG. 1 shows an inventive apparatus for producing a data stream of code words of variable length.

FIG. 1 shows an inventive apparatus 10 for producing a data stream of code words of variable lengths, which apparatus has an input 12 and an output 14. At the input 12, the code words of variable lengths are present, whereas at the output 14, the error-robust data stream is output. The code words of variable lengths at the input 12 of the apparatus 10 have preferably already been pre-sorted such that priority code words are in a first set, less important code words are in a second set and even less important code words are in a third set, etc.

The code words of variable lengths are input into a device 16 for writing the code words of the first set into the data stream such that the code words of the first set each start at raster points.

Moreover, the code words of variable lengths are input into a device 18 for writing the code words of the second set into the data stream, a different segment being assigned to each code word of the second set. The data stream between the two devices 16 and 18 is therefore a data stream in which merely all code words of the first set are entered at raster points. In case the code words of variable lengths consist of only two sets of code words, then the error-robust data stream is already present at the output of the device 18. In case there are more than two sets of code words of variable lengths, there are further devices for writing the code words of the corresponding set into the data stream, which is symbolically illustrated by reference numeral 20.

Figure 2:
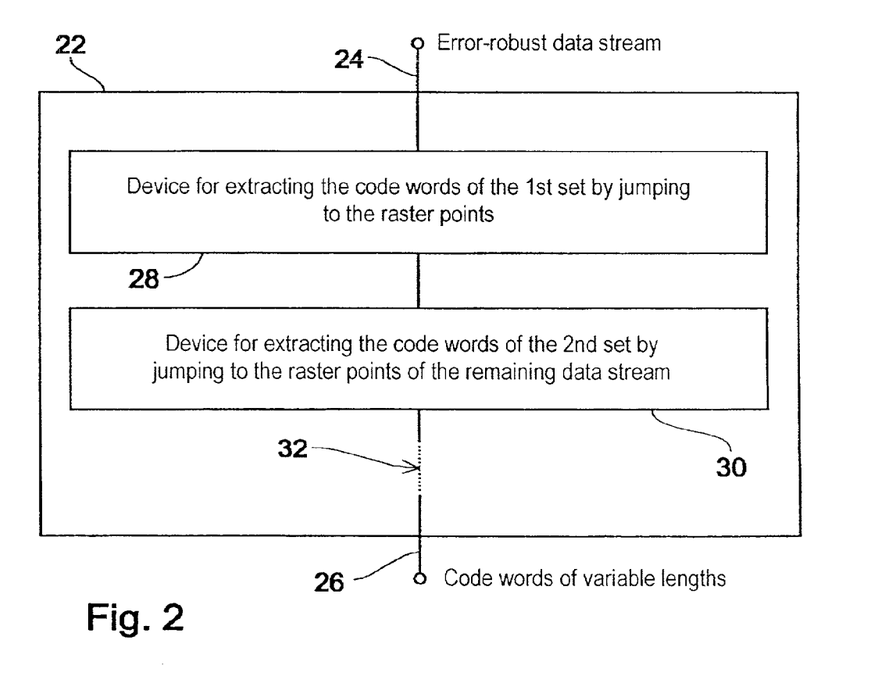
FIG. 2 shows an inventive apparatus for reading a data stream having code words of variable lengths.

FIG. 2 shows an inventive apparatus 22 for reading the error-robust data stream output at the output 14 (FIG. 1), which has an input 24 and an output 26. At the input 24, the error-robust data stream is input in order to output, at the output 26, code words of variable lengths whose order corresponds to the order that was present at the input 12 (FIG. 1). The apparatus 22 for reading the data stream includes a device 28 for extracting the code words of the first set by jumping to the raster points, a downstream device 30 for extracting the code words of the second set by jumping to the raster points of the remaining data stream and, if need be, further devices 32 for extracting code words in accordance with the further sets, in case any such sets are present.

Before the method carried out by the apparatus 10 (FIG. 1) is explained in detail on the basis of FIG. 3 by means of an example, a summary of the method will first be given. The code words available are divided up into a plurality of sets. Each set, except for the last one, includes as many code words as there are segments available. In the best case, one set contains as many code words as there are segments available. However, one set may also contain more or fewer code words, as it will almost necessarily be the case for the last set, since a predetermined number of code words of variable lengths must be assumed. In case M segments are present and in case a set has N code words, the number of the code words which are written to raster points corresponds to the minimum of M and N, whereas the number of attempts to accommodate the N code words in the raster in accordance with the invention corresponds to the maximum of M and N.

Preferably, the first set contains the most important code words, i.e. the priority code words, which represent information symbols which are more significant in comparison with the other information symbols. The following sets contain fewer important code words in the order as is provided by a pre-sorting algorithm, which preferably also carries out the classification into priority code words and non-priority code words. These sets are successively written by the device 10. Writing one set should require several attempts. In the first attempt, the first code word of the current set is written into the first segment, and so on, until the last code word of the current set is written into the last segment. Of course, one may start with the second, with the third or with any other segment and then write in every segment in accordance with a certain specified regulation.

In case a code word does not fit into a segment, the remaining part of this code word is stored. In a second attempt, the remaining part of the first code word, in case it exists, is preferably written into the second segment, etc., until the remaining part of the last code word is preferably written into the first segment. Such an algorithm can also be referred to as modulo shift. Obviously, the predetermined regulation as to whether a remainder of a code word is to be written into the following segment, into the next-but-one segment, etc., in the next run, i.e. in the next attempt, is arbitrary.

Once a set has been completely written, the writing of the next set starts. In order to prevent propagation errors even more in accordance with a preferred embodiment of the present invention, the direction of writing within the segment is changed from set to set. For example, code words of the first set are written from left to right, whereas code words of the second set are written from right to left, etc. Therefore, with the present invention, the second side of a raster point is utilized for absolute error protection, as it were, also in accordance with this preferred embodiment.

The use of the system briefly summarized above can very strongly reduce the number of error propagation possibilities for a certain code word. As the sets are written successively and as each code word of a set is assigned to a certain segment and is also written into the segment, in case there is still room in the segment, no error propagation from one code word within one set to the next code word within the set is possible, since a decoder always jumps from segment to segment when decoding and does not assume the start of a code word to be where the preceding one ended, as is the case in the prior art. In case a code word is only partially written into this segment, since the space available is not sufficient for completely entering the code word, the possibility of error propagation is at least reduced.

In accordance with a preferred embodiment of the present invention, the segment width is selected such that the priority code words completely fit in the segments. Therefore, writing the first set requires only one attempt. However, this is arbitrary. Since, generally, a high number of raster points for one data stream, i.e. a segment length as small as possible, is aimed at, the case that also code words of the first set are longer than the segment length may also arise. However, this case would be treated like writing the second set, i.e. also in accordance with a predetermined regulation which must be known to the encoder as well as to the decoder.

Figure 3:
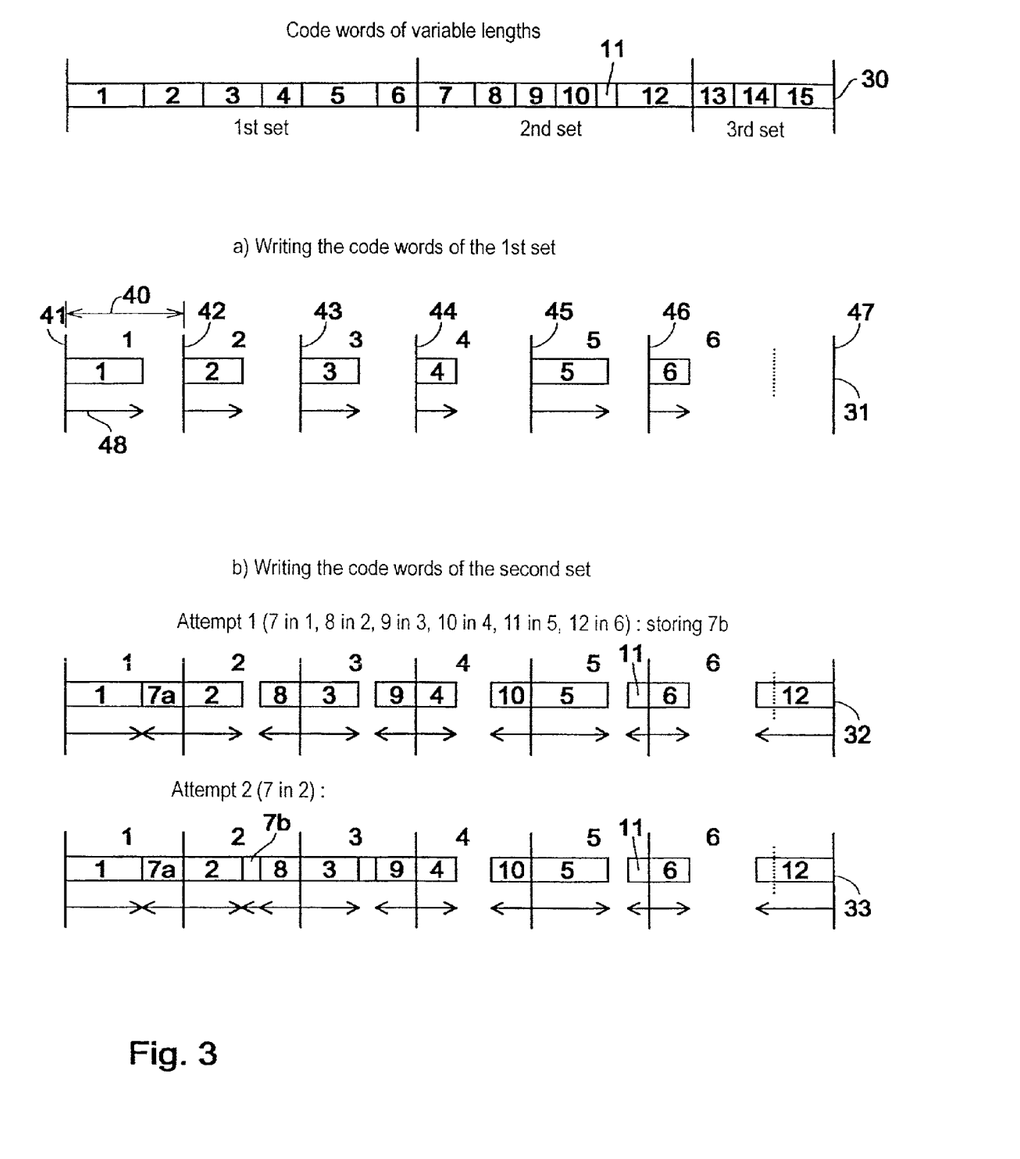
FIG. 3 shows a procedural diagram of the inventive method by means of three sets of code words of variable lengths.

FIG. 3 illustrates, by means of an example, the inventive method for writing code words of variable lengths. In the example, there are 15 code words of variable lengths 30 which are preferably divided up into a first set having 6 code words 1 to 6, into a second set also having 6 code words 7 to 12 and into a third set having the remaining 3 code words 13 to 15. As is shown in FIG. 3, code words 30 have variable lengths.

In accordance with a preferred embodiment of the present invention, the segment length, i.e. the length of the segment, is longer than the length of the longest code word of the first set. The code words of the first set are arranged at raster points 41 to 46, wherein, for the last segment No. 6, a raster point is indicated by a dotted line, which raster point is not used, however, since the end 47 of the data stream can also be considered as a raster point as it were and since the raster point indicated by a dotted line is thus superfluous. The first segment No. 6 is therefore longer than the other segments, which is completely irrelevant for the present invention, however. Generally speaking, the segments may have any lengths, which change within the data stream, it being understood that the current length of a segment must be known to the decoder so that the inventive advantages can be utilized.

Firstly, the code words of the first set are written into the data stream in a step a), which results in a fragmentary data stream indicated by 31, in which the code words of the first set are written into a respective segment from left to right, as is indicated by arrows 48 which are to symbolize the direction of writing in the entire FIG. 3. Since the segment length is selected to be longer than the longest length of a code word of the first set, only one single attempt is needed for step a). In case the segments are shorter, more attempts are required accordingly.

Now the code words of the second set are written into the data stream 31 in a step b). In order to achieve high error robustness, the code words of the second set are preferably not written from left to right like the code words of the first set, but are written from right to left, starting from the second raster point, respectively, e.g. the raster point 42 for the first segment, as is indicated by the respective arrow of writing direction. The writing of the code words of the second set takes place in accordance with a predetermined assignment rule which says, in the example selected, that the first code word of the second set is to be written in the same segment as the first code word of the first set, however always on the condition that there is still room in this segment. The data stream 32 resulting from the first attempt shows that in the first segment there was only so much room for writing the starting section of code word No. 7.

In contrast to the prior art, where the second part of code word No. 7 would have been written into the second segment, the second half of code word No. 7, i.e. 7 b), is stored for writing it into the data stream in a second attempt in accordance with a predetermined regulation, i.e. in accordance with an regulation which must also be known to the decoder. FIG. 3 clearly shows that in the second segment, there was still enough room between code word Nos. 2 and 8 for the final section of code word No. 7 to be entered. In case there had not been enough room, the third section of the code word would have been entered into segment No. 3. Thus, in FIG. 3, the predetermined regulation for entering code word No. 7 into the data stream consists in proceeding by one segment in each case. Of course, one may also proceed by two segments or by three or more, such that, as a consequence, the second segment 7 b) could then be written, instead of the second segment, into the third, into the fifth in the next attempt, etc. The order of segments which is used to accommodate the second part of section 7 somewhere is arbitrary. However, it must be transparent to the decoder so that the re-sorted data stream can be re-read.

The code words of the third set 13 to 15 are now to be entered into the resulting data stream 33, which is also still fragmentary. By analogy with step b), this is done preferably by the same assignment rule such that the first code word of the third set is assigned to the first segment, that the second code word of the third set is assigned to the second segment, that the third code word of the third set is assigned to the third segment, etc. This assignment rule is entirely arbitrary for the third set and may also be different from the assignment rule for the second set, with each code word of a set being assigned to a different segment in accordance with the invention.

The first attempt in step c) was successful only in that the first section of code word No. 15 was entered, resulting in a fragmentary data stream 34. Code words 13, 14 and the second section of code word 15, i.e. 15 b) are stored for being accommodated in the second, third, fourth, fifth and sixth attempts, wherein the second section 15b could be accommodated in the fourth segment in the second attempt (data stream 35), wherein nothing could be accommodated in the third attempt, wherein the starting section of code word 14 could be accommodated in the fourth attempt (data stream 36), wherein the final section of code word 14, i.e. 14b could be accommodated in the fifth attempt (data stream 37) and wherein, finally, the first code word of the third set could be entered in the sixth segment in the sixth and final attempt, which results in the error-robust data stream 38 for the example illustrated here. The method described using FIG. 3 ensures that the length of the error-robust data stream exactly corresponds to the sum of the lengths of the code words of variable lengths, which is self-evident for the purposes of entropy encoding for data reduction. However, the present invention is not limited to the error-robust data stream having the minimal length, since error robustness is not affected by any filler bits that may be present.

When regarding the robust data stream shown in FIG. 3, it can be seen that the start of code word No. 8, i.e. raster point 43, is entirely independent of the end of code word No. 7. Moreover, the start of code word No. 9, i.e. raster point 44, is entirely independent of the end of code word No. 8. Additionally, it should be noted that due to the opposite writing order, a data error in code word No. 1 in the first segment, for example, which leads to the fact that the incorrect code word is one bit shorter than the correct code word No. 1 due to the data error, does not lead to a destruction of the starting section of code word No. 7a, since the latter was written from right to left instead of from left to right. In case it had been written from left to right, a decoder would take the remaining bit from the initially correct code word No. 1 as the starting bit of code word No. 7, which would result in a sequence error from 1 to 7. However, this sequence error would not propagate to 8, since code word No. 8, again, is entirely independent of code word No. 7, since the writing order was chosen to be from right to left. In case the writing order of code word No. 8 is equal to the writing order of the code words of the first set, the error would not propagate from 7 to 8 either, since code word No. 8 would be written adjacent to code word No. 2 before the second part 7b due to the assignment rule and is, therefore, not influenced by an incorrect section 7b.

Figure 4:
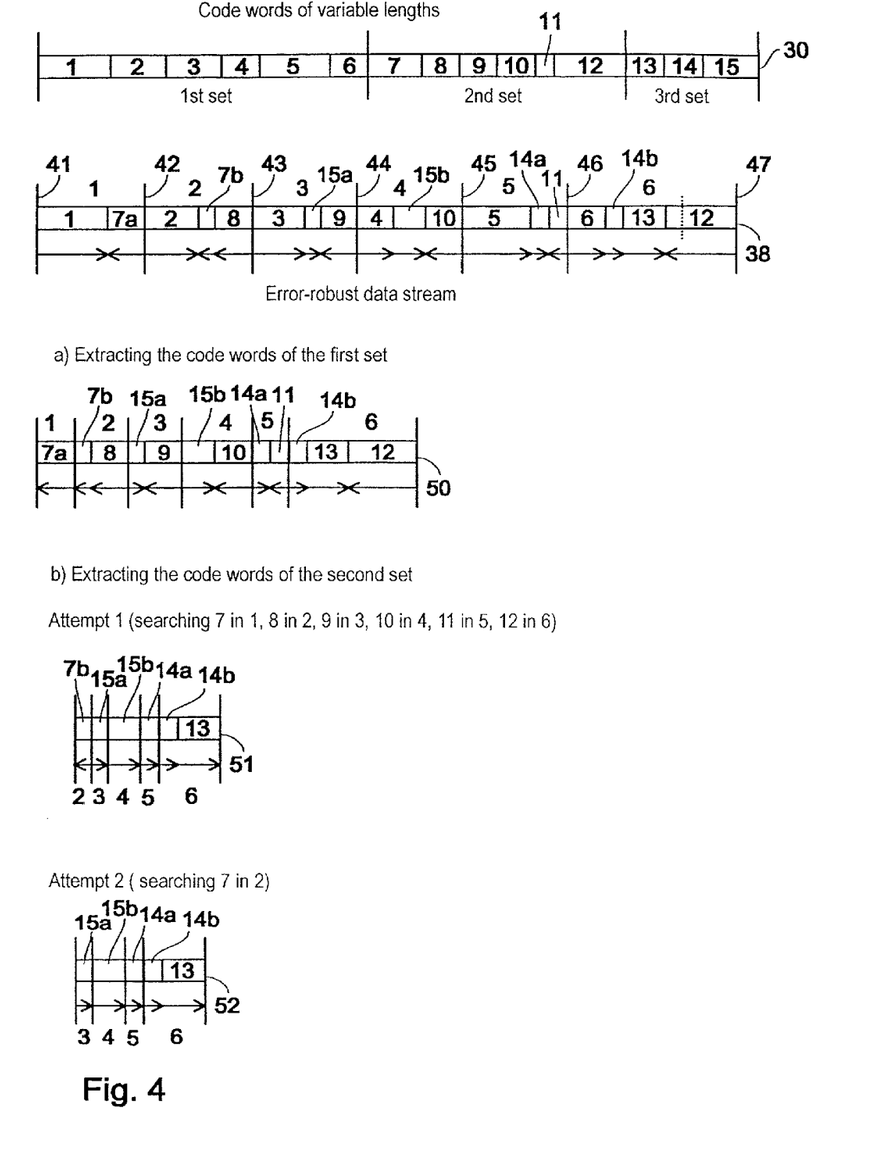
FIG. 4 shows a procedural diagram for illustrating the inventive method for reading a data stream which has been produced in accordance with FIG. 3.

By means of an appropriate example, FIG. 4 shows the operation of the apparatus for reading the error-robust data stream 38. Initially, the code words of the first set are extracted from the error-robust data stream in step a).

For this purpose, the inventive apparatus, which may be coupled to a Huffman decoder, reads the code word of the first set starting from the first raster point 41, reads code word No. 2 of the first set starting from the second raster point 42, etc., until all code words 1 to 6 of the first set have been read in. It is self-evident that the apparatus for reading the data stream selects the same direction as has been used by the apparatus for producing.

Subsequently, the code words of the second set are extracted from the remaining data stream 50 in step b). Here, the decoder jumps to the second raster point 42 of the first segment and obtains the starting section of code word 7 of the second set, whereupon it does not read in the second section 7b, but 7a is first stored in order to then read in the second code word of the second set starting from the second raster point of the second segment, etc. The result is a residual data stream 51 in which the first segment has been completely emptied. Since the decoder does not now read the code word 7 continuously, but always reads segment by segment on the basis of the assignment rule used for the apparatus for producing the data stream, the error robustness which has already been described and which strongly reduces propagation of sequence errors is ensured.

In a second attempt for extracting the code words of the second set, the second part of code word 7b is now read in the second segment in accordance with the existing writing direction, whereupon only code words of the third set remain in the resulting data stream 52. (The second segment is now also empty.) These are extracted in step c), wherein the starting section of code word 15 has been initially determined in a first attempt, which is not stored however, since code word 15 has not been found complete in the third segment. The third segment is now also empty, however, the raster points still exist in order for the decoder to be able to orient itself by them. In a second attempt, code word 15 can be found complete. However, the search for code word 14 in segment 3 and for code word 15 in segment 14 remained without success, which can be seen by the data stream 54.

Nevertheless, in the fourth attempt, the search for code word 14 in the fifth segment lead to a positive result. However, code word 14 was not complete, which is why the starting section 14a was stored in order to examine the remaining data stream 55 in a fifth attempt and to fully read in, in a final sixth attempt, data stream 56, which now only consists of the sixth segment and of code word 13.

Even though in the previous example merely a division of code words into a starting section and a final section was illustrated by way of example, any type of division is possible in principle. Error-robust decoding will be ensured as long as the decoder observes the assignment of code words of the second set or of the third set and of further sets to different segments, respectively. Moreover, it is obvious that the sorting of the final sections of code words into the data stream is arbitrary as long as the decoder or the read-in circuit upstream of the decoder knows exactly which predetermined regulation has been carried out in the encoder.

The invention claimed is:

1. Method for producing a data stream of code words of variable lengths which are divided up into a plurality of sets of code words, a raster having raster points existing for the data stream, two adjacent raster points defining one segment, and the raster comprising a plurality of segments, the method including the following steps:

encoding an audio signal generating the code words of variable lengths, the code words of variable lengths representing the audio signal;

a1) writing the code words of the first set such that starts of the code words are at raster points of different segments;

b1) in case the respective code word fits in the segment, writing each code word of the second set into a segment which is assigned to each individual code word pursuant to a predetermined assignment rule, wherein each code word of the second set is assigned a different segment pursuant to the predetermined assignment rule;

b2) in case only a part of the respective code word fits in the assigned segment or in case the assigned segment is full, writing the part of the respective code word of the second set into the assigned segment and storing the remainder of the code word or, in case the assigned segment is full storing the entire code word which is assigned the full segment;

b3) writing the stored remainder or the stored entire code word, which did not fit in the respective segments in steps b1), b2), into an area of the raster which is not written onto after steps b1) and b2), pursuant to a second predetermined regulation, until all code words of the second set have been written into the raster.

2. Method as claimed in claim 1, in which the code words of the first set are present in an order, wherein these are written into adjacent segments in accordance with their order.

3. Method as claimed in claim 1, in which, in case of a code word of the first set which is longer than a segment, the remainder of the code words is written into an area of the raster which is not written onto after step a1), pursuant to a first predetermined regulation, until all code words of the first set have been written into the raster, the first predetermined regulation being as follows:

i) writing at least a part of the remainder of a code word of the first set into the segment following the segment in which the starting section of the code word is present, in case there is room, in the segment, for at least part of the remainder; and ii) conducting step (i) for remainders of all further code words of the first set in case such code words are present; and iii) conducting steps (i), (ii), wherein one proceeds by one segment for each remainder until all code words of the first set have been written into the data stream.

4. Method as claimed by claim 1, in which the code words of the second set are present in an order and the predetermined assignment rule assigns the first code word of the second set to that segment in which the start of the first code word of the first set is present, assigns the second code word of the second set to that segment in which the start of the second code word of the first set is present and, in case existent, assigns each further code word of the first set that segment in which the start of the corresponding code word of the first set is present.

5. Method as claimed by claim 1, in which the second predetermined regulation is equal to the first predetermined regulation.

6. Method as claimed by claim 1, in which, pursuant to the first or second predetermined regulation, a code word of the corresponding set which does not entirely fit into the assigned segment falls in three or more parts in case there is only so much room in the segments following the assigned segment that, again, a remainder remains.

7. Method as claimed by claim 1, in which the raster points are arranged equally spaced apart, whereby equally long segments, except for the final segment, result, wherein the equally long segments are longer than or as long as the longest code word of the first set, such that each code word of the first set fits in the corresponding segment.

8. Method as claimed by claim 1, in which the code words of the first set are written in a first writing direction starting from the first raster points of the segments, respectively, and in which the code words of the second set are written in a second writing direction opposite to the first writing direction, starting from the second raster points of the segments, respectively.

9. Method as claimed in claim 8, in which a third set of code words is present, wherein the third code words are again, written into the raster in the first writing direction after all code words of the second set have been written into the raster.

10. Method as claimed by claim 1, in which the code words are Huffman code words.

11. Method as claimed by claim 1, in which code words of the first set represent more significant information symbols than code words of the second set or of further sets.

12. Method as claimed in claim 11, in which the information symbols are spectral values of an audio signal and code words of the first set are spectral values significant from a psycho-acoustic point of view, which are to be protected from any error propagation due to a transmission error in the data stream.

13. Method as claimed by claim 1, in which the length of the data stream produced is equal to the sum of the lengths of the code words of variable lengths.

14. Method as claimed by claim 1, in which more than two sets of code words are present and which further comprises the following step:

conducting steps b1), b2) and b3) for the code words of the further sets of code words, wherein the second predetermined regulation corresponds to the second predetermined regulation of step b2) and wherein the predetermined assignment rule corresponds to the predetermined assignment rule of step b1).

15. Method as claimed by claim 1, in which there are as many code words in the first set of code words as there are segments in the data stream, and in which the number of code words in the other set or sets is equal to or smaller than the number of code words in the first set, such that all code words of the first set are written to raster points.

16. Method as claimed in claim 1, in which, in case of a code word of the first set which is longer than a segment, the remainder of the code words is written into an area of the raster which is not written onto after step a1), pursuant to a first predetermined regulation, until all code words of the first set have been written into the raster.

17. Method for reading a data stream of code words of variable lengths, the code words of variable lengths representing an encoded audio signal, wherein the data stream comprises code words of a plurality of sets of code words, wherein a raster is specified for the data stream, which comprises raster points in which two adjacent raster points define a segment, wherein the data stream comprises at least two segments, which method includes the following steps:

a) extracting the code words of the first set from the data stream by the following individual steps:
a1) for each segment, jumping to a raster point and reading a code word starting there;

b) extracting the code words of the second set of code words from the data stream remaining after step (a) by the following individual steps:
b1) for each remaining segment, jumping to a raster point of the segment on the basis of a predetermined assignment rule which was used when producing the data stream, and reading the code word starting there, in order to obtain the code words of the second set;
b2) in case a code word of the second set is not finished at the end of a corresponding segment, storing the read section of the code word of the second set;
b3) determining the remainder of the code word or the code word not present at a raster point, on the basis of a second predetermined regulation which was used when producing the data stream; and decoding the code words of variable lengths to obtain a decoded audio signal.

18. Method as claimed in claim 17, in which the data stream comprises more than two sets of code words, which method further includes the following step:

extracting the code words of the third set by repeating steps b1), b2) and b3), wherein the second predetermined regulation is equal to the second predetermined regulation of step b3) and wherein the assignment rule is equal to the assignment rule of step b1).

19. Method as claimed in claim 17, in which the assignment rule, which was used when producing the data stream, assigns a first code word of the second set to a segment in which the first code word of the first set starts, wherein, in step b1), one jumps to the first raster point in order to obtain the first code word of the second set, one jumps to the second raster point in order to obtain the second code word of the second set, etc., wherein, in case no or only part of a code word of the second set starts at the first raster point, one initially reads starting from all raster points, before a missing code word or a missing part of a code word is determined on the basis of the second predetermined regulation.

20. Method as claimed by claim 17, in which in case of a code word of the first set, which starts at a raster point is not finished at the end of the segment, the read section of the code word is stored, and the remainder of the code word is determined on the basis of a first predetermined regulation which was used when producing the data stream, the first predetermined regulation being as follows:

for each stored section of a read code word, jumping to the next raster point in the data stream which remains after step a1) in order to determine the remainder of the code word;

in case a code word can be read to the end, connecting the code word which has been read to the end with the stored section in order to obtain the code word of the first set completely, otherwise storing a section which may have been read and repeating the step of jumping to the next raster point, until all code words of the first set are present.

21. Method as claimed in claim 17, in which in case of a code word of the first set, which starts at a raster point is not finished at the end of the segment, the read section of the code word is stored, and the remainder of the code word is determined on the basis of a first predetermined regulation which was used when producing the data stream.

22. Apparatus for producing a data stream of code words of variable lengths which are divided up into a plurality of sets of code words, wherein a raster having raster points is present for the data stream, in which two adjacent raster points define a segment, the raster comprises a plurality of segments, the apparatus comprising:

an encoder for encoding an audio signal to generate the code words of variable lengths, the code words of variable lengths representing the audio signal;

a) a device for writing the code words of the first set such that starts of code words are present at raster points of different segments; and b) a device for writing each code word of the second set into a segment which is assigned to each individual code word pursuant to a predetermined assignment rule, wherein each code word of the second set is assigned a different segment pursuant to the predetermined assignment rule, in case the respective code word fits in the segment, wherein the device is arranged so as in case only part of the respective code word fits in the assigned segment or in case the assigned segment is full, to write the part of the respective code word of the second set into the assigned segment and to store the remainder of the code word (7b) or, in case the assigned segment is full, storing the entire code word which is assigned the full segment;

to write the stored remainder and the stored entire code word, which did not fit in the respective segments in steps b1), b2), into an area of the raster which is not written onto after steps b1) and b), pursuant to a second predetermined regulation, until all code words of the second set have been written into the raster.

23. Apparatus as claimed in claim 22, in which the device for writing the first set of code words is operative, in case a code word is longer than a segment, to write the remainder of the code word into an area of the raster which is not written onto after step a1), pursuant to a first predetermined regulation, until all code words of the first set have been written into the raster.

24. Apparatus for reading a data stream of code words of variable lengths, the code words of variable lengths representing an encoded audio signal, in which the data stream comprises code words of a plurality of sets of code words, wherein, for the data stream, a raster is specified which comprises raster points, wherein two adjacent raster points define a segment, wherein the data stream comprises at least two segments, which apparatus comprises the following:

a) a device for extracting the code words of the first set from the data stream, which is arranged so as to for each segment, to jump to a raster point and to read a code word starting there;

b) a device for extracting the code words of the second set of code words from the data stream which remains after step a), which is arranged so as to jump, for each remaining segment, to a raster point of the segment on the basis of a predetermined assignment rule which was used when producing the data stream and to read the code word starting there in order to obtain the code words of the second set, in case a code word of the second set is not finished at the end of a corresponding segment, to store the read section of the code word of the second set;

to determine the remainder of the code word or the code word not present at a raster point on the basis of a second predetermined regulation which was used when producing the data stream; and a decoder for decoding the code words of variable lengths to obtain a decoded audio signal.

25. Apparatus as claimed in claim 24, in which the device for extracting the code words of the first set is operative, in case the code word starting at a raster point is not finished at the end of the segment, to store the read section of the code word; and to determine the remainder of the code word on the basis of a first predetermined regulation which was used when producing the data stream.

* * * * *